United States Patent
Lin et al.

(10) Patent No.: US 10,658,320 B1
(45) Date of Patent: May 19, 2020

(54) SEMICONDUCTOR DEVICE INCLUDING CONDUCTIVE STRUCTURE

(71) Applicant: Winbond Electronics Corp., Taichung (TW)

(72) Inventors: Chun-Hung Lin, Taichung (TW); Yen-Jui Chu, Taichung (TW); Kao-Tsair Tsai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/546,293

(22) Filed: Aug. 20, 2019

(30) Foreign Application Priority Data

Nov. 21, 2018 (TW) .............................. 107141491 A

(51) Int. Cl.
  *H01L 23/00* (2006.01)
(52) U.S. Cl.
  CPC .............. *H01L 24/14* (2013.01); *H01L 24/03* (2013.01); *H01L 24/06* (2013.01); *H01L 24/11* (2013.01); *H01L 24/13* (2013.01); *H01L 2224/0231* (2013.01); *H01L 2224/0233* (2013.01); *H01L 2224/0401* (2013.01); *H01L 2224/13022* (2013.01); *H01L 2224/13024* (2013.01); *H01L 2224/13025* (2013.01)
(58) Field of Classification Search
  None
  See application file for complete search history.

(56) References Cited

U.S. PATENT DOCUMENTS

| 9,059,106 B2 * | 6/2015 | Daubenspeck ..... H01L 23/3114 |
| 2007/0152327 A1 | 7/2007 | Chia et al. |
| 2009/0283895 A1 * | 11/2009 | Kikuchi .............. H01L 23/5389 257/692 |
| 2010/0237506 A1 * | 9/2010 | Brunnbauer ............ H01L 24/11 257/773 |
| 2015/0179602 A1 | 6/2015 | Camacho et al. |
| 2019/0229028 A1 * | 7/2019 | Mohammed ........ H01L 23/3114 |

FOREIGN PATENT DOCUMENTS

| CN | 101536181 | 9/2009 |
| TW | 201640599 | 11/2016 |
| TW | 201826420 | 7/2018 |

* cited by examiner

*Primary Examiner* — J. E. Schoenholtz
(74) *Attorney, Agent, or Firm* — JCIPRNET

(57) ABSTRACT

A semiconductor device is provided and includes a first pad and a second pad, a first conductive connector and a second conductive connector, a first conductive structure and a second conductive structure. The first conductive connector and the second conductive connector are disposed over the first pad and the second pad. The first conductive structure is electrically connected to the first pad and the first conductive connector, and includes a first portion, a second portion and a connecting portion connecting the first and second portions. The first portion and the second portion are not overlapped in a vertical direction, and the first portion, the connecting portion and the second portion are integrally formed. The second conductive structure is electrically connected to the second pad and the second conductive connector, wherein a portion of the second conductive structure is overlapped with the first conductive structure therebeneath in the vertical direction.

10 Claims, 11 Drawing Sheets

SEMICONDUCTOR DEVICE INCLUDING CONDUCTIVE STRUCTURE

CROSS-REFERENCE TO RELATED APPLICATION

This application claims the priority benefit of Taiwan application serial no. 107141491, filed on Nov. 21, 2018. The entirety of the above-mentioned patent application is hereby incorporated by reference herein and made a part of this specification.

BACKGROUND

Technical Field

The invention relates to a semiconductor device.

Description of Related Art

It is possible to increase the number of solder balls that may be placed on a wafer by Wafer Level Chip Scale Package (WLCSP) technology. However, it involves a complicated process, and thus the cost for manufacturing the semiconductor device is increased.

SUMMARY

The invention provides a semiconductor device that maximizes the number of conductive connectors that may be placed on the surface of the semiconductor device.

In some embodiments of the invention, a semiconductor device includes a first pad, a second pad, a first conductive connector, a second conductive connector, a first conductive structure, and a second conductive structure. The first conductive connector and the second conductive connector are disposed over the first pad and the second pad. The first conductive structure is electrically connected to the first pad and the first conductive connector, and the first conductive structure includes a first conductive portion, a second conductive portion on the first conductive portion, and a connecting portion connecting the first conductive portion and the second conductive portion. The first conductive portion and the second conductive portion are not overlapped in a vertical direction, and the first conductive portion, the connecting portion, and the second conductive portion are integrally formed. The second conductive structure is electrically connected to the second pad and the second conductive connector, and in the vertical direction, a portion of the second conductive structure overlaps with the first conductive structure therebeneath.

In some embodiments of the invention, the first conductive connector and the first pad are not overlapped in the vertical direction.

In some embodiments of the invention, the first conductive structure is in direct contact with the first pad and the first conductive connector.

In some embodiments of the invention, a first dielectric layer is further included, and the first dielectric layer includes a first block, a second block with a top surface higher than the first block, and an inclined block connecting the first block and the second block. The first conductive portion, the connecting portion, and the second conductive portion are respectively disposed on the first block, the inclined block, and the second block.

In some embodiments of the invention, a second dielectric layer covering the first conductive structure is further formed, and a second conductive structure is formed on the second dielectric layer, and a top surface of the second dielectric layer is substantially coplanar with a top surface of the first dielectric layer.

In some embodiments of the invention, the first dielectric layer further includes an opening that exposes the first pad, and the first conductive structure is electrically connected to the first pad through the opening.

In some embodiments of the invention, a second dielectric layer between the first conductive structure and the second conductive structure is further included, the second dielectric layer includes an opening that exposes the first conductive structure, and the first conductive structure is electrically connected to the first conductive connector through the opening.

In some embodiments of the invention, a portion of the second conductive structure is disposed between the first conductive portion and the second conductive portion in the vertical direction.

In some embodiments of the invention, the second conductive structure further includes a through via on the portion of second conductive structure, and the through via is in direct contact with the portion of second conductive structure.

In some embodiments of the invention, the third conductive structure is further included, the portion of the second conductive structure is disposed between the top surface and the bottom surface of the third conductive structure, and in the vertical direction, the third conductive structure overlaps with a portion of the second conductive structure therebeneath.

Based on the above, the semiconductor device of the embodiment in the invention includes a conductive structure buried in a dielectric layer between a pad and a conductive connector such as a solder ball to electrically connect the pad and the conductive connector. That is to say, the conductive structure does not occupy the area of the wafer surface, so that the number of conductive connectors that may be placed on the wafer surface may be maximized.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
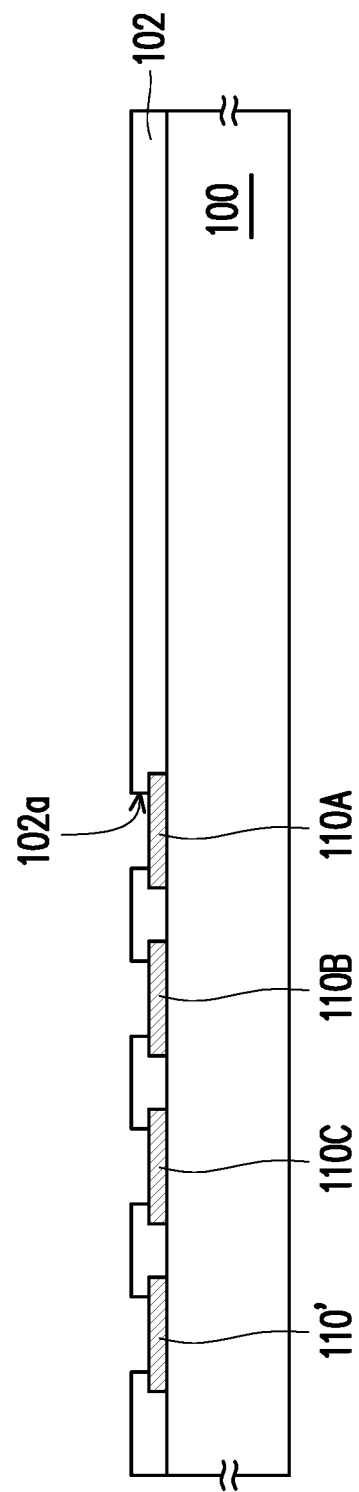
FIGS. 1A to 1J schematic cross-sectional views of a manufacturing method of a semiconductor device in accordance with some embodiments of the invention.

FIGS. 1A to 1J schematic cross-sectional views of a manufacturing method of a semiconductor device in accordance with some embodiments of the invention. It is noted that, for convenience of explanation, FIGS. 1A to 1J only depict a portion of a top surface of a wafer, and in addition, the dimension and the number of the components shown in the drawings are for illustrative purposes only, and they are not the actual dimension and the number or intended to limit the invention.

Referring to FIG. 1A, first, a wafer 100 is provided, and the wafer 100 has first to third pads 110A, 110B, 110C on its surface. In some embodiments, a pad 110' is further disposed on the surface of the wafer 100. Specifically, in some embodiments, the wafer 100 is provided with two types of pads thereon. The first type of pad is offset from the conductive connector connected thereto in the horizontal direction, so that the conductive structure designed by the invention may be required. That is, the first type of pad is not overlapped with the conductive connector connected thereto in the vertical direction, and the projection area of the first type of pad onto the substrate is not overlapped with the projection area of the conductive connector connected thereto onto the substrate. For example, the first to third pads 110A, 110B, 110C are of the first type. The second type of pad is electrically connected to the conductive connector thereover by a general via, so that the pad is overlapped with the conductive connector connected thereto in the vertical direction. For example, the pad 110' is of the second type. In some embodiments, the wafer 100 includes, for example, a substrate (not shown) and a wiring structure (not shown) on the substrate, and the wiring structure includes a plurality of dielectric layers and a plurality of conductive layers stacking on one another. The wiring structure is electrically connected to the first to third pads 110A, 110B, 110C and the pad 110', for example. In addition, in an embodiment, the wafer 100 may further include components disposed in the substrate or on the substrate, and the components may be transistors, diodes, capacitors, or resistors. In some embodiments, the first to third pads 110A, 110B, 110C, and the pad 110' are, for example, disposed in the dielectric layer 102 on the wafer 100. That is, the dielectric layer 102 is formed on the first to third pads 110A, 110B, 110C and the pad 110', and the dielectric layer 102 includes the opening 102a exposing the first to third pads 110A, 110B, 110C and the pad 110', respectively. In some embodiments, top surfaces of the first to third pads 110A, 110B, 110C, and pad 110' are, for example, substantially coplanar. In some embodiments, the spacing between the first to third pads 110A, 110B, 110C and the pad 110' is, for example, the same, but the invention is not limited thereto. That is, in some alternative embodiments, the spacing between the first to third pads 110A, 110B, 110C and the pad 110' may be different. In particular, although in some embodiments, three first type pads (i.e., the first to third pads 110A, 110B, 110C) and one second type pad (i.e., the pad 110') are configured on the wafer 100 as an example. However, the invention is not limited thereto. In some alternative embodiments, the wafer 100 may also be configured with two or more than three first type pads, and no second type pad or more than one second type pads. In addition, it should be noted that although the conductive members are formed on the wafer as an example in some embodiments, the invention is not limited thereto, and in some alternative embodiments, the conductive members may also be applied in other semiconductor devices other than a wafer, such as a chip.

Figure 1B:
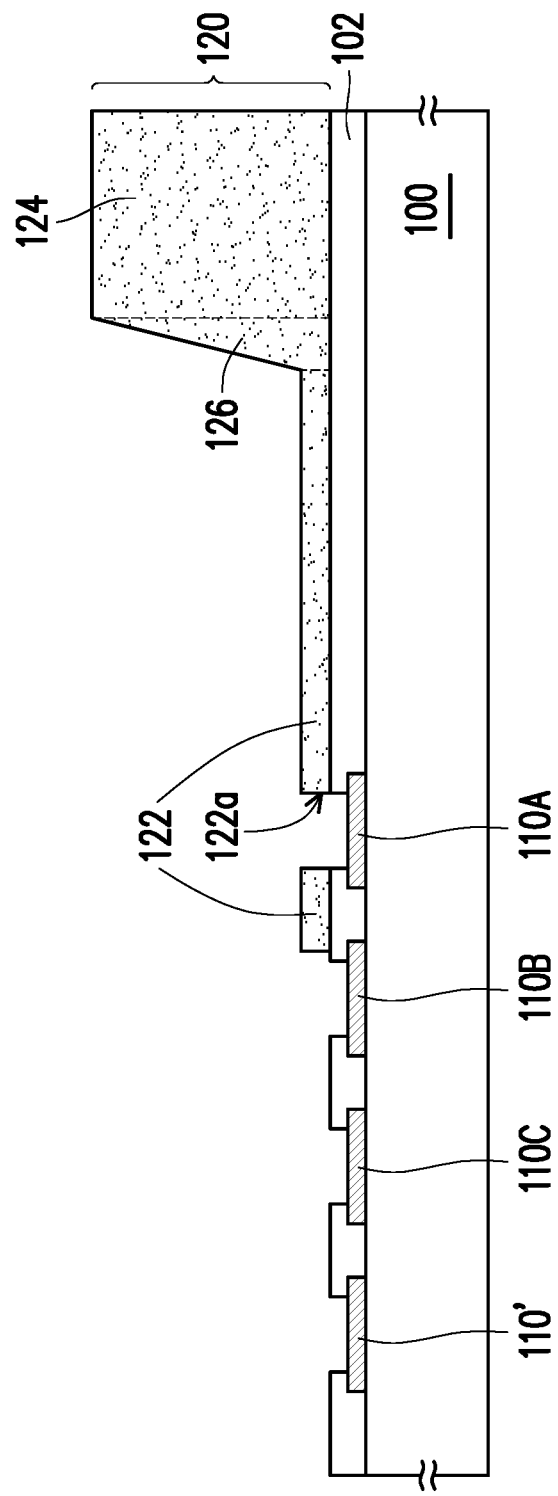

Referring to FIG. 1B, a first dielectric layer 120 is formed on the wafer 100. In some embodiments, the first dielectric layer 120 is formed on the dielectric layer 120, for example. The first dielectric layer 120 includes, for example, a first block 122, a second block 124 having a top surface higher than the first block 122, and an inclined block 126 connecting the first block 122 and the second block 124. In some embodiments, the first block 122 and the second block 124 respectively have a flat top surface, and a top surface of the inclined block 126 is, for example, gradually lowered from the height at which the top surface of the second block 124 is disposed to the height at which the top surface of the first block 122 is disposed. In some embodiments, the height of the first block 122 is, for example, equal to or greater than 4 μm, and the height of the second block 124 is, for example, equal to or greater than 12 μm. The ratio of the height of the second block 124 to the height of the first block 122 is, for example, 3:1. The angle between the top surface of the inclined block 126 and the top surface of the first block 122 is, for example, less than or equal to 90 degrees. In some embodiments, the width of the first block 122 is, for example, similar to the width of the conductive connector to be formed later. The first block 122 includes, for example, an opening 122a which exposes the first pad 110A. In some embodiments, the edge of opening 122a is, for example, aligned with the edge of opening 102a, but the invention is not limited thereto. In some alternative embodiments, the first dielectric layer 120 may be filled in a portion of the opening 102a to cover the first port 110A or expose the first dielectric layer 120 adjacent to the first pad 110A.

In some embodiments, the first dielectric layer 120 is formed, for example, by 3D printing method, and the printing direction is, for example, from the first pad 110A to the third pad 110C. That is to say, the second block 124, the inclined block 126, and the first block 122 may be sequentially formed. In some embodiments, the printing ink is, for example, insulating and sticky.

Figure 1C:
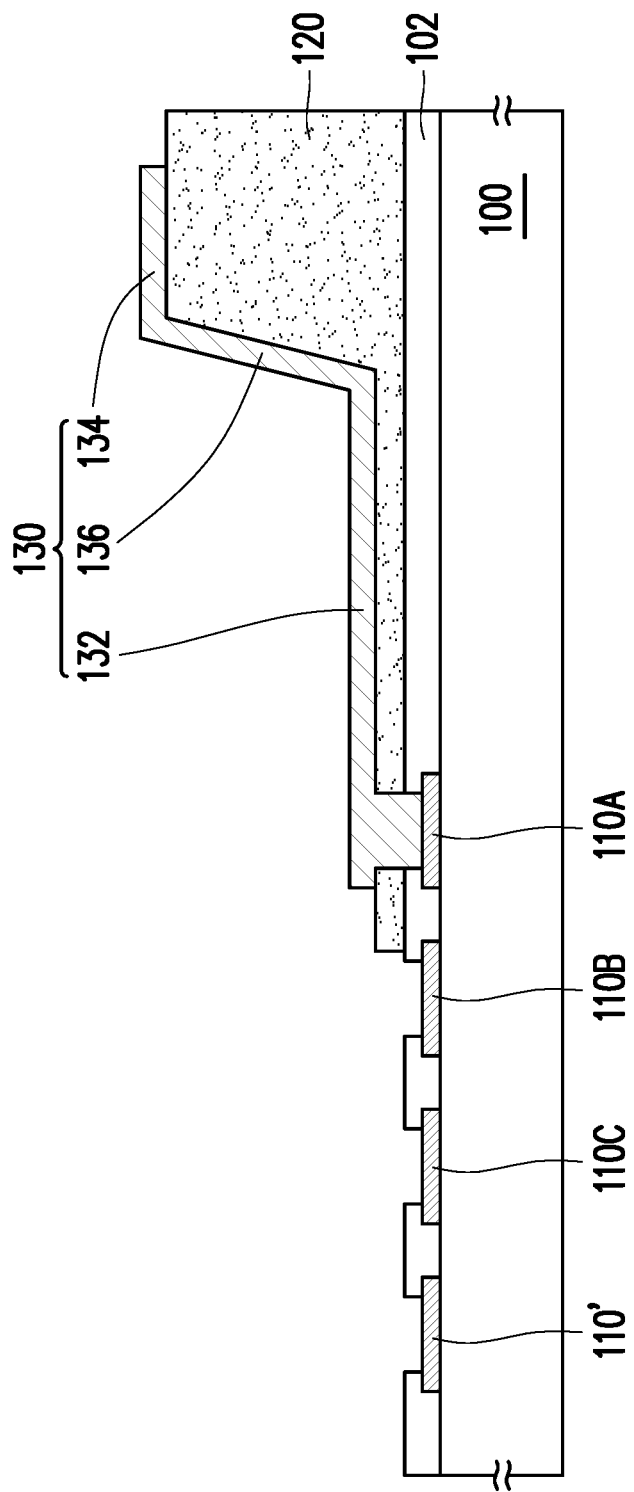

Referring to FIG. 1C, a first conductive structure 130 is then formed on the first dielectric layer 120. The first conductive structure 130 includes a first conductive portion 132, a second conductive portion 134 on the first conductive portion 132, and a connecting portion 136 between the first conductive portion 132 and the second conductive portion 134. The first conductive portion 132, the connecting portion 136, and the second conductive portion 134 are integrally formed. in some embodiments, the first conductive portion 132, the connecting portion 136, and the second conductive portion 134 are formed continuously, for example, so that the first conductive structure 130 is integrally formed. In some embodiments, the first conductive portion 132, the connecting portion 136, and the second conductive portion 134 are disposed on and in direct contact with the first block 122, the inclined block 126, and the second block 124 respectively, for example. In some embodiments, the first conductive portion 132 extends horizontally on the first block 122 and is filled in the opening 122a to be electrically connected to the first pad 110A, for example. The connecting portion 136 extends on the inclined block 126 which is a sloped ground, for example. In some embodiments, the second conductive portion 134 extends horizontally on the second block 124, for example. In some embodiments, a gap is formed between the exposed end of the first conductive portion 132 and the edge of the first block 122, for example. In addition, a gap is formed between the exposed end of the second conductive portion 134 and the edge of the second block 124, for example. That is, the first conductive structure 130 does not cover the relative edges of the first dielectric layer 120. Accordingly, the exposed end of the first conductive portion 132 may be covered by the subsequently formed second dielectric layer 140 to avoid the exposure, and the exposed end of the second conductive portion 134 is prevented from electrically connecting with the second pad 110B.

In some embodiments, the first conductive structure 130 is formed, for example, by 3D printing method, and the printing direction is, for example, from the second block 124 to the first block 122. That is, the second conductive portion 134, the connecting portion 136, and the first conductive portion 132 are sequentially formed. In some embodiments, the printing ink is, for example, a conductive ink. Moreover, by 3D printing method, the connecting portion 136 may be uniformly, easily and entirely formed on the inclined block 126, so that the occurrence of disconnection may be avoided. In addition, since the first conductive portion 132 is formed by 3D printing method, even if the first conductive portion 132 is partially filled in the opening 122a, the first conductive portion 132 may have a substantially flat surface without being slightly concave corresponding to the opening 122a. Furthermore, compared with the conventional process by which a plurality of pads are formed on the entire wafer surface at once, the second conductive portions 134 serving as the pads may be separately formed by the 3D printing method. In other words, the pads may be separately formed or repaired. Of course, in some alternative embodiments, the first conductive structure 130 may also be formed by other suitable methods. In some embodiments, the material of the first conductive structure 130 may include a metal material such as aluminum, silver, copper or the like. In some embodiments, the thickness of the first conductive structure 130 is, for example, equal to or greater than 1 μm.

Figure 1D:
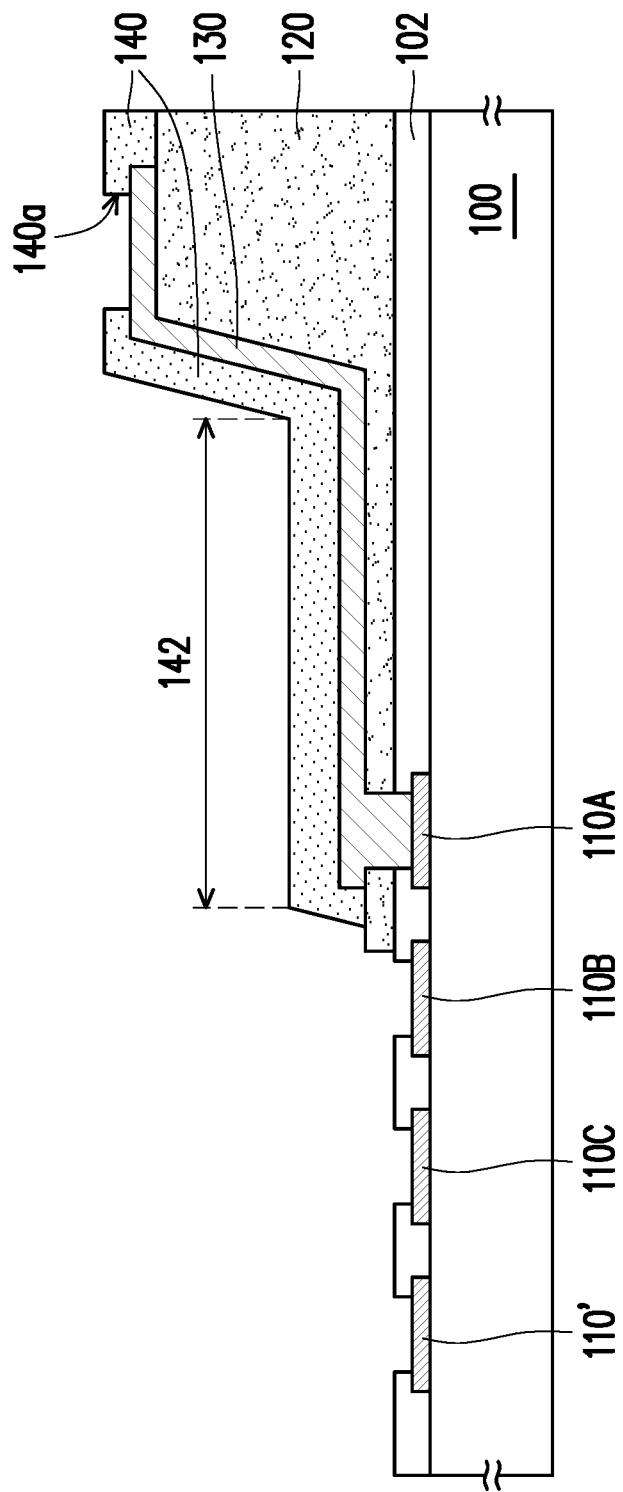

Referring to FIG. 1D, a second dielectric layer 140 is formed on the first conductive structure 130 to cover the first conductive structure 130. In some embodiments, the topmost surface of the second dielectric layer 140 is, for example, flush with the topmost surface of the first dielectric layer 120. In some embodiments, the second dielectric layer 140 includes, for example, a block 142 having a height between the first block 122 and the second block 124. The block 142 has, for example, a flat top surface. Further, the second dielectric layer 140 includes, for example, an opening 140a exposing a portion of the first conductive structure 130. In some embodiments, except that the opening 140a exposes a portion of the conductive structure 130, the second dielectric layer 140 entirely covers the first conductive structure 130, that is, covering the opposite exposed ends of the first conductive structure 130 (i.e., covering the exposed end of the first conductive portion 132 and the exposed end of the second conductive portion 134. As such, the first conductive structure 130 is embedded in the first dielectric layer 120 and the second dielectric layer 140, and is electrically insulated from the second pad 110B. Further, in some embodiments, the second dielectric layer 140 covers at least one of the opposite edges of the first dielectric layer 120.

Figure 1E:
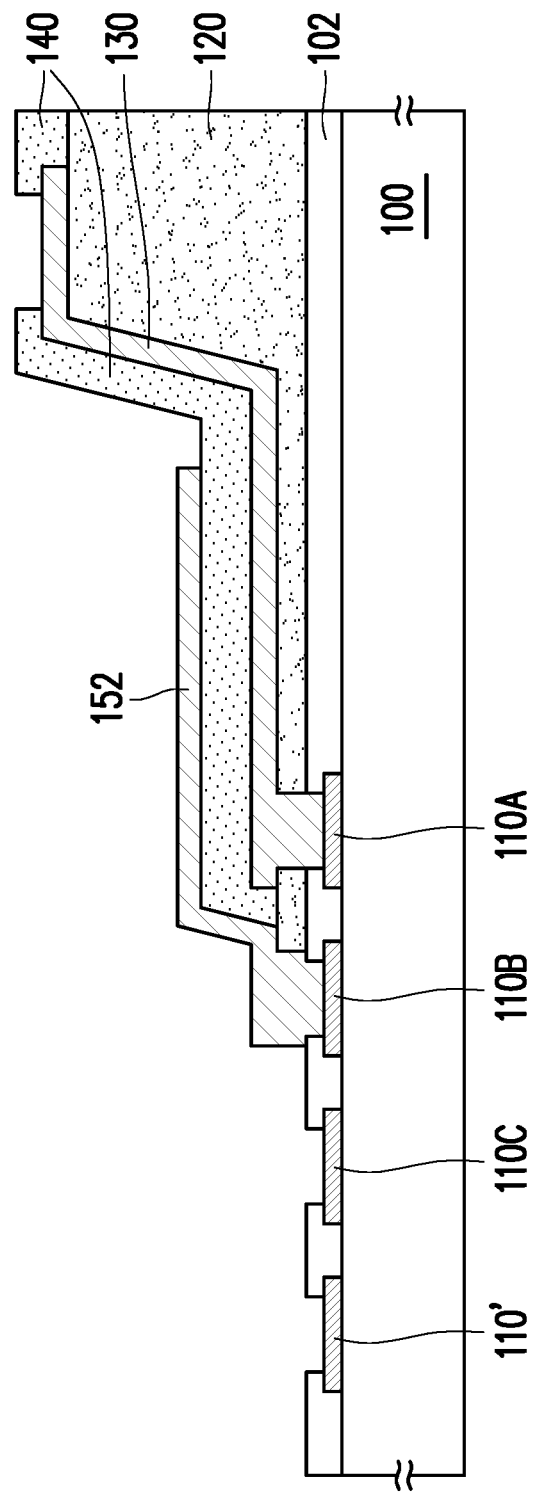

Referring to FIG. 1E, a conductive portion 152 is then formed on the second dielectric layer 140. In some embodiments, the conductive port 152 is, for example, disposed on the block 142 and filled in the opening 102a to electrically connect to the second pad 110B. In some embodiments, the conductive port 152 extends onto the dielectric layer 102 across the opening 102a but is insulated from the third pad 110C. In some embodiments, in the vertical direction, the conductive portion 152 is disposed between the first conductive portion 132 and the second conductive portion 134, and the conductive portion 152 overlaps with the first conductive portion 132 therebeneath. In some embodiments, the material and formation method of the conductive port 152 may refer to the foregoing for the first conductive structure 130, and the material and formation method of the conductive portion 152 may be the same as or different from the first conductive structure 130.

Figure 1F:
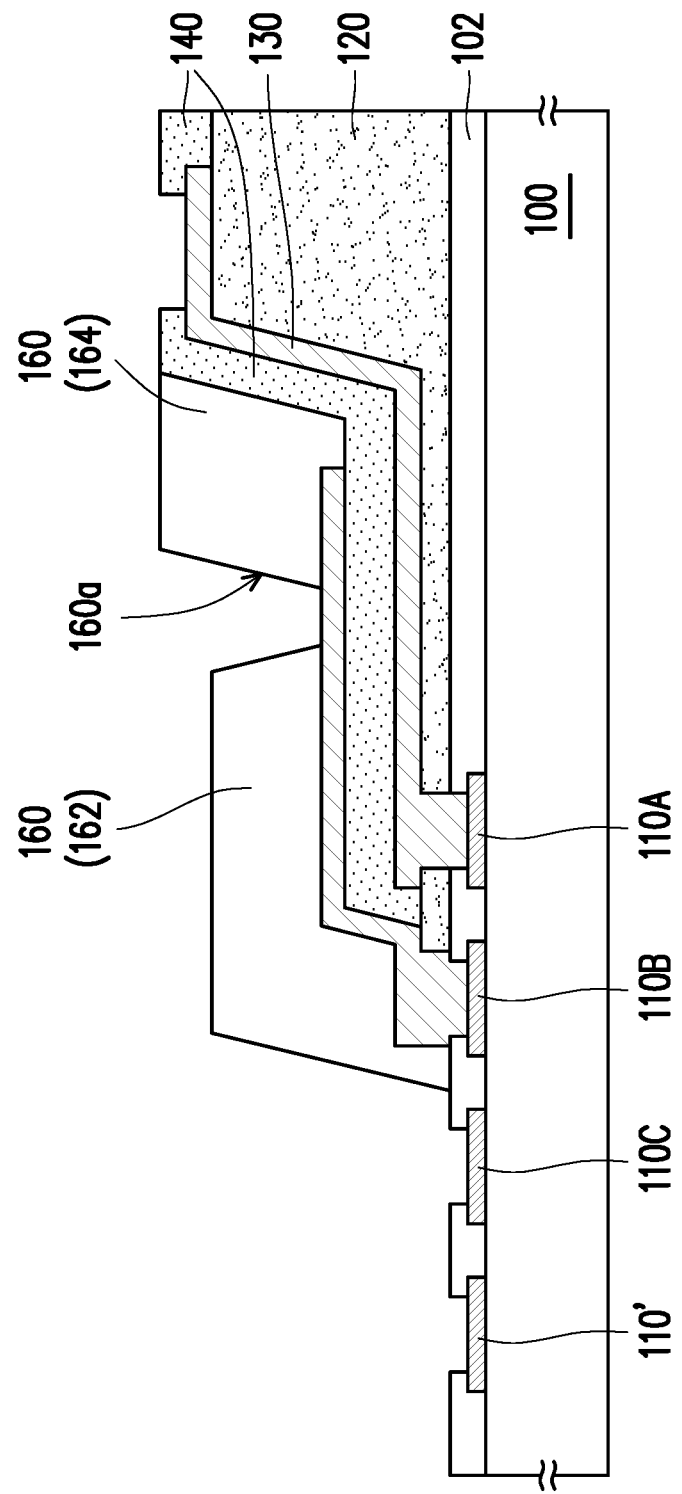

Referring to FIG. 1F, a third dielectric layer 160 is formed on the conductive portion 152 and the second dielectric layer 140, and the third dielectric layer 160 has an opening 160a exposing the underlying conductive structure (i.e., the conductive portion 152). In some embodiments, the third dielectric layer 160 includes, for example, a block 162 and a block 164 having a height difference therebetween, and the opening 160a is formed, for example, between the block 162 and the block 164. In some embodiments, the block 162 is, for example, lower than the block 164, and the top surface of block 164 (i.e., the topmost surface of third dielectric layer 160) is, for example, coplanar with the topmost surface of second dielectric layer 140. In some embodiments, the material and formation method of the third dielectric layer 160 may refer to the foregoing for the first dielectric layer 120, and the material and formation method of the third dielectric layer 160 may be the same as or different from the first dielectric layer 120.

Figure 1G:
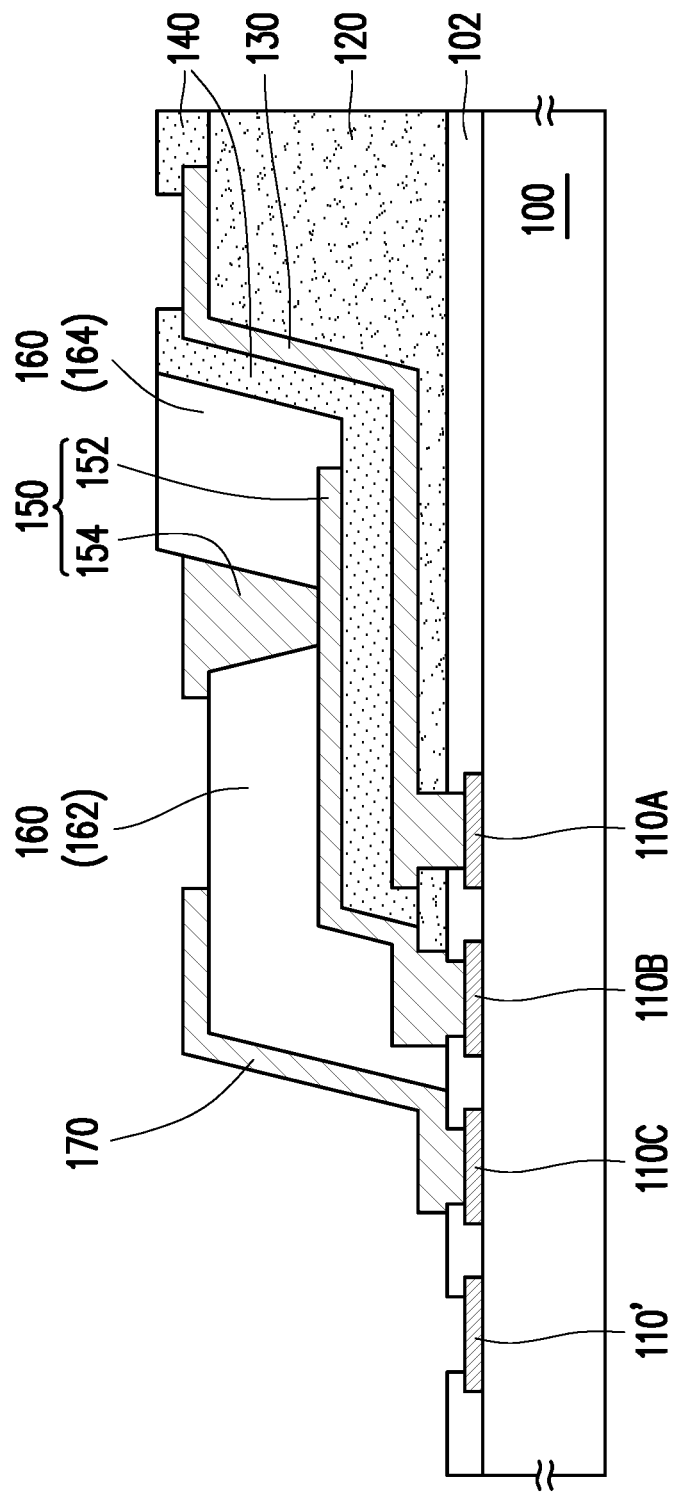

Referring to FIG. 1G, a through via 154 is formed in the opening 160a to electrically connect to the conductive portion 152. In some embodiments, a top surface of through via 154 is, for example, coplanar with the top surface of the second conductive portion 134. The conductive portion 152 and the through via 154 form a second conductive structure 150, and the topmost surface of the second conductive structure 150 is, for example, coplanar with the topmost surface of the first conductive structure 130. In some embodiments, since the conductive portion 152 and the through via 154 may both be formed by 3D printing method, and may be composed of, for example, the same material, there is substantially no interface between the conductive port 152 and the through via 154. In some embodiments, the second conductive structure 150 is embedded in the second dielectric layer 140 and the third dielectric layer 160, and is electrically insulated from the first conductive structure 130 and the first pad 110A.

Next, a third conductive structure 170 is formed on the third dielectric layer 160. In some embodiments, the third conductive structure 170 is formed, for example, on the block 162 and filled in the opening 102a to electrically connect to the third pad 110C. In some embodiments, the third conductive structure 170 is separated from the through via 154 to avoid electrical connection with the second conductive structure 150. Moreover, the third conductive structure 170 extends onto the dielectric layer 102 from the block 162 and across the opening 102a. In some embodiments, in the vertical direction, the third conductive structure 170 overlaps with the second conductive structure 150 therebeneath. In some embodiments, the material and formation method of the third conductive structure 170 may refer to the foregoing for the first conductive structure 130, and the material and formation method of the third conductive structure 170 may be the same as or different from the first conductive structure 130 and the second conductive structure 150.

Figure 1H:
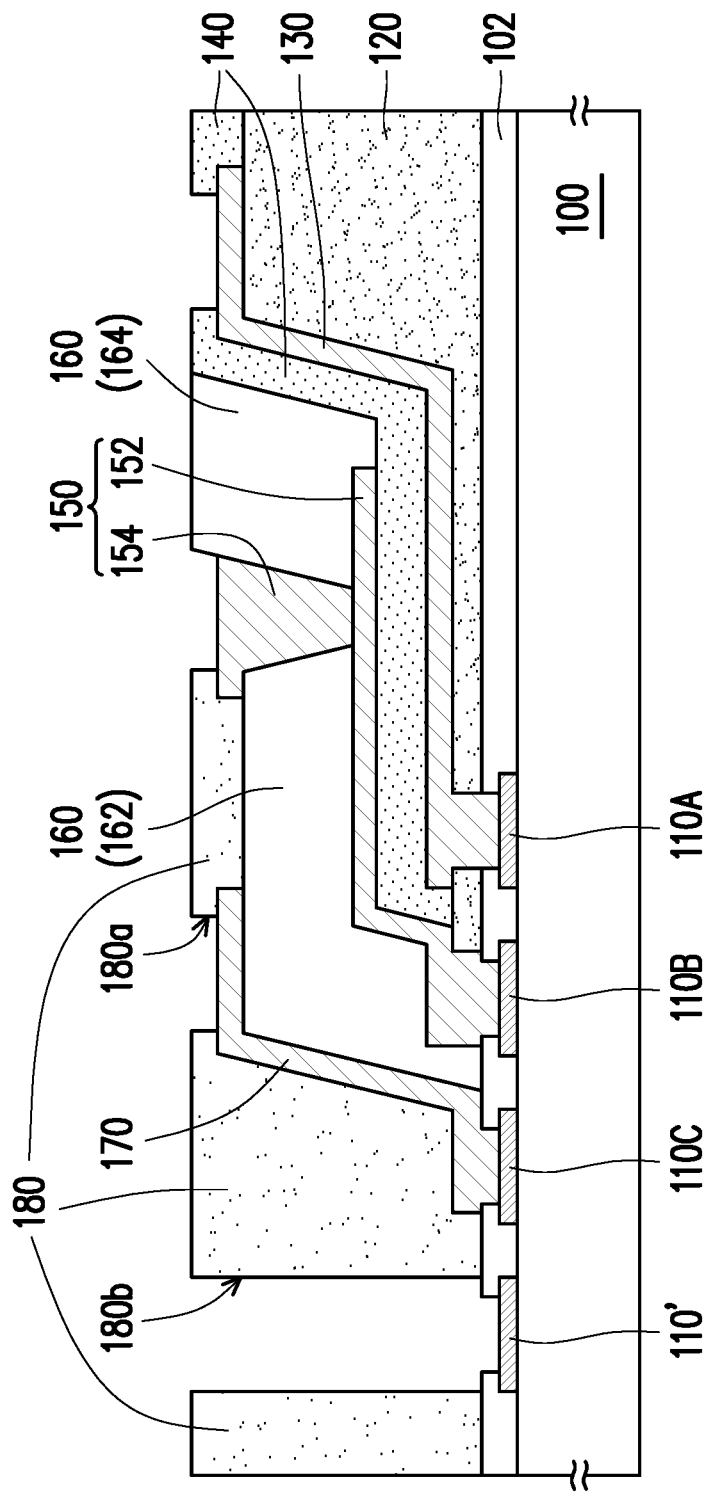

Referring to FIG. 1H, a fourth dielectric layer 180 is formed on the third conductive structure 170, and an opening 180a is formed between the fourth dielectric layer 180 and the third dielectric layer 160 to expose the top of the second conductive structure 150. It is noted that in some embodiments, the sidewall of the block 164 serves as both the sidewall of the opening 180a and the sidewall of the opening 160a, so that the sidewall of the opening 180a is substantially flush with the sidewall of the opening 160a. In some embodiments, the top surface of the fourth dielectric layer 180 is, for example, flush with the topmost surface of the third dielectric layer 160. In some embodiments, the fourth dielectric layer 180 covers the exposed dielectric layer 102, for example. In some embodiments, the material and formation method of the fourth dielectric layer 180 may refer to the foregoing for the first dielectric layer 120, and the material and formation method of the fourth dielectric layer 180 may be the same as or different from the first to third dielectric layers 120, 140, 160. In some embodiments, the third conductive structure 170 is embedded in the third dielectric layer 160 and the fourth dielectric layer 180, and is electrically insulated from the second conductive structure 150 and the second pad 110B. In some embodiments, the fourth dielectric layer 180 includes, for example, a via opening 180b, and the via opening 180b exposes the pad 110' therebeneath. Specifically, the via opening 180b extends through the fourth dielectric layer 180 and is disposed directly above the pad 110'.

Figure 1I:
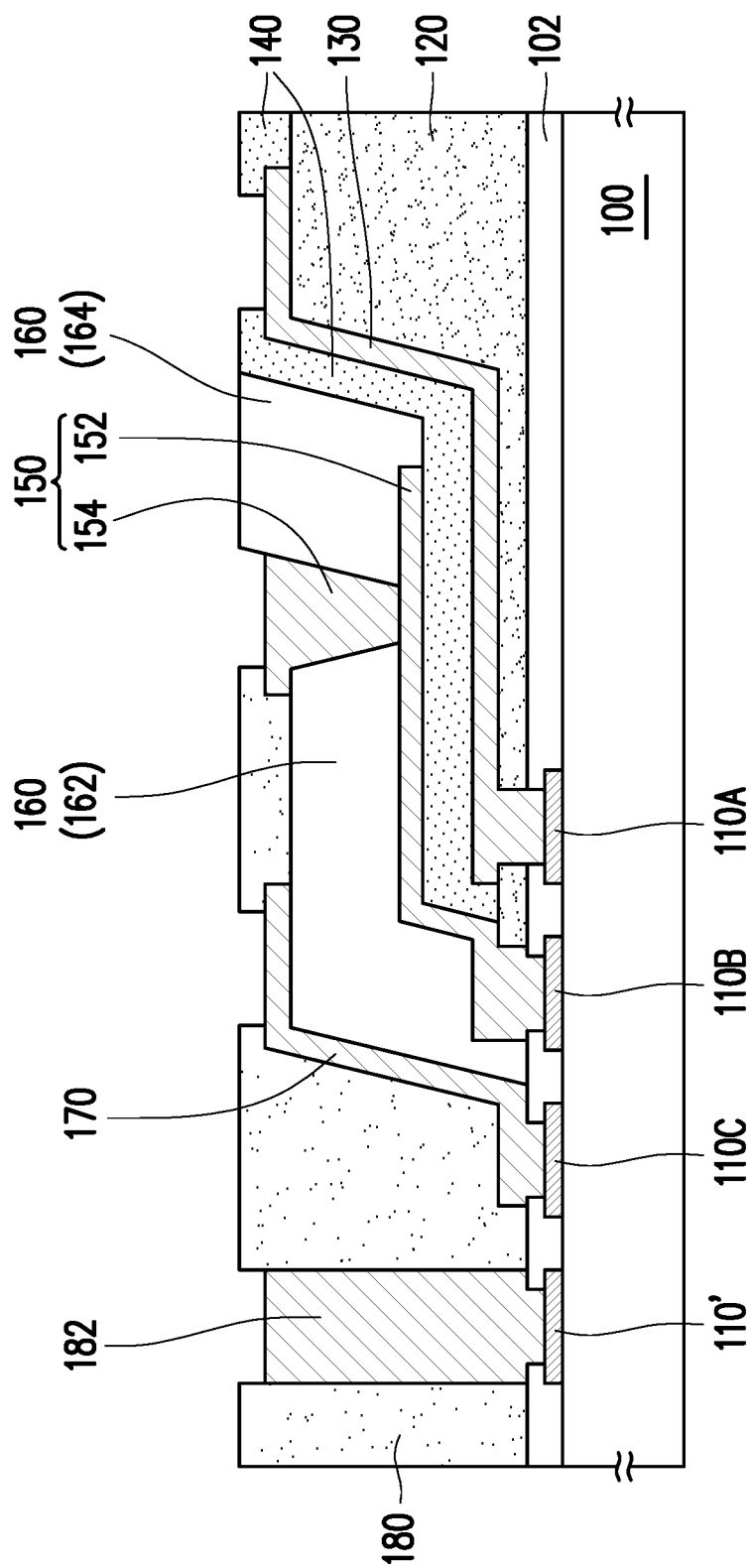

Referring to FIG. 1I, next, a via 182 is further form in the via opening 180b.

Figure 1J:
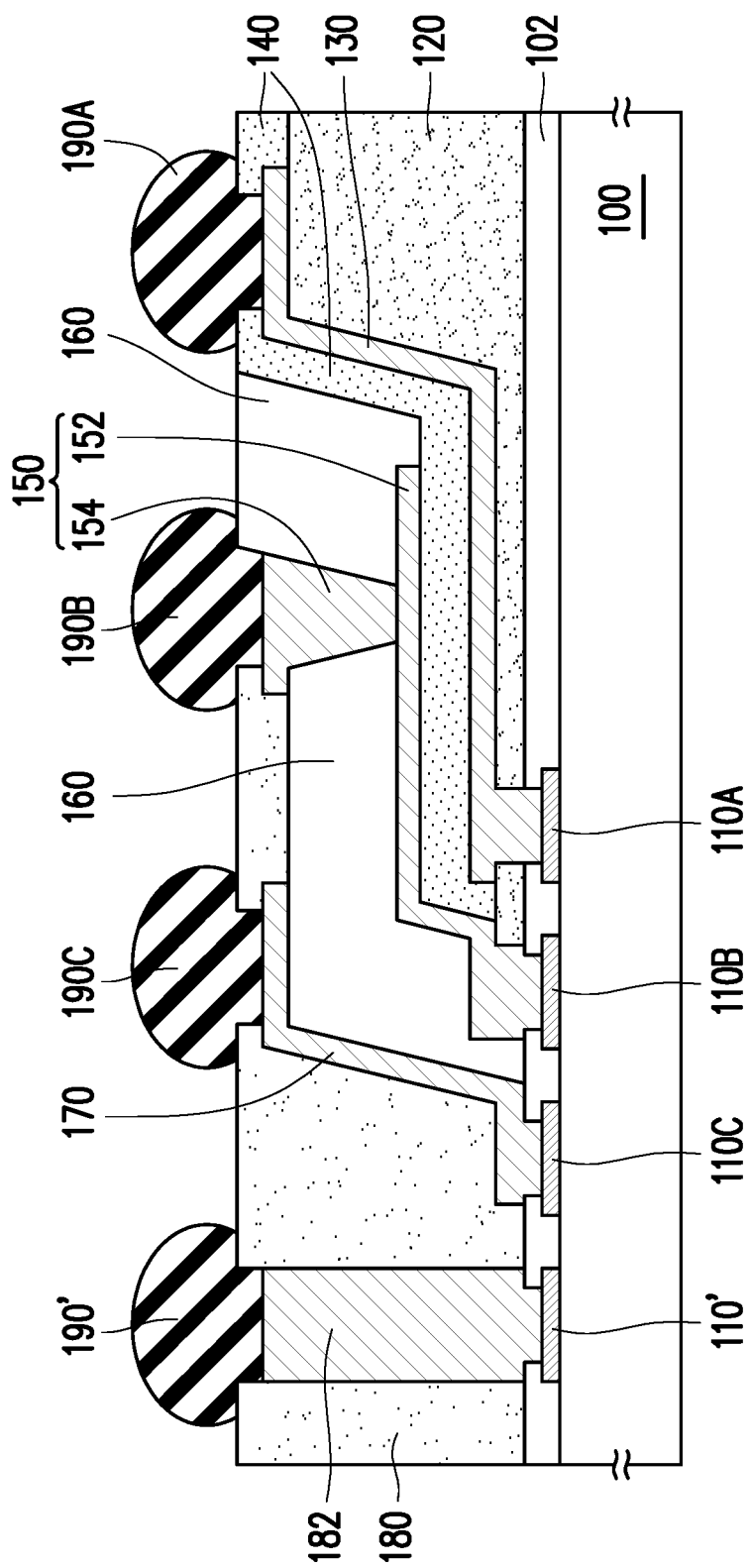
Figure 2:
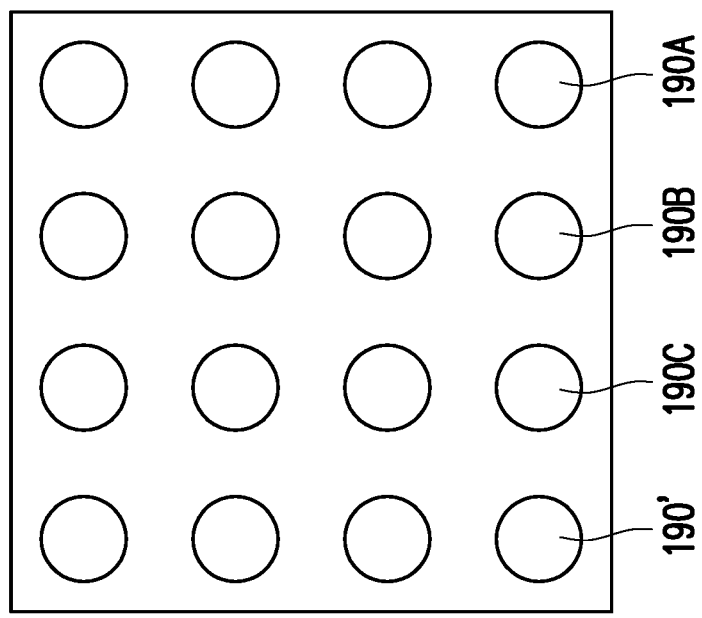
FIG. 2 is a top view of a semiconductor device in accordance with some embodiments of the invention.

Referring to FIG. 1J and FIG. 2 simultaneously, first to third conductive connectors 190A, 190B, and 190C are formed in the opening 140a, 160a, and 180a, respectively. In some embodiments, the conductive connector 190' is formed in the via opening 180b. The first to third conductive connectors 190A, 190B, and 190C are electrically connected to the first to third pads 110A, 110B, and 110C through the first to first conductive structures 130, 150, and 170, respectively. In some embodiments, the first, second or third conductive connector 190A, 190B or 190C are, for example, not overlapped in a vertical direction with the first, second or third pad 110A, 110B or 110C respectively electrically connected thereto. In some embodiments, the first, second or third conductive connector 190A, 190B or 190C and the first, second or third pad 110A, 110B or 110C do not overlap in the vertical direction respectively, That is, from the top view, the first, second or third conductive connector 190A, 190B or 190C are not overlapped with the first, second or third pad 110A, 110B or 110C respectively, and the projection area of the first, second or third conductive connector 190A, 190B or 190C onto the substrate is not overlapped with the projection area of the first, second or third pad 110A, 110B or 110C onto the substrate respectively. However, the invention is not limited thereto. In some alternative embodiments, the first to third conductive connector 190A, 190B, 190C and the first to third pads 110A, 110B, 110C may be or be not partially overlapped in the vertical direction. In some embodiments, the first to third conductive structures 130, 150, 170 extend continuously between the first to third pads 110A, 110B, 110C and the first to third conductive connectors 190A, 190B, 190C, respectively, and are, for example, in physically contact with the first to third pads 110A, 110B, respectively. 110C and the first to third conductive connector 190A, 190B, 190C. In some embodiments, the conductive connector 190' is disposed directly above the pad 110' and overlaps with the pad 110' in the vertical direction. In some embodiments, the first to third conductive connectors 190A, 190B, 190C and the conductive connector 190' are, for example, arranged in an array, and the distance between adjacent ones of the first to third conductive connectors 190A, 190B, 190C and the conductive connector 190' is, for example, substantially the same.

In some embodiments, the first to fourth dielectric layers 120, 140, 160, 180 have a substantially coplanar top surface, thereby providing a substantially flat surface for forming the first to third conductive connectors 190A, 190B, 190C and the conductive connector 190. In some embodiments, the first to third conductive connectors 190A, 190B, 190C and the conductive connector 190' may be conductive balls such as solder balls, and the forming method thereof may be, for example, screen printing, but the invention is not limited thereto. For example, in some alternative embodiments, the first to third conductive connectors 190A, 190B, 190C and the conductive connector 190' may also be suitable conductive connectors such as conductive posts.

It may be known from the above process that in some embodiments, a ground dielectric layer (such as a first dielectric layer 120) having a height difference is first formed, and conductive structures (such as first to first conductive structures 130, 150, 170) and dielectric layers (such as the second to fourth dielectric layers 140, 160, 180) are sequentially and alternately stacked on the ground dielectric layer. The conductive structure is formed by extending onto the dielectric layer along the direction from the pads to the conductive connector, and is overlapped with the conductive structure therebeneath in the vertical direction. The dielectric layer is fabricated by covering the entire conductive structure and exposes the top surface of the conductive structure, such that the conductive structure is embedded in the two adjacent dielectric layers.

What is claimed is:

1. A semiconductor device, comprising:
   a first pad and a second pad;
   a first conductive connector and a second conductive connector, disposed over the first pad and the second pad;
   a first conductive structure, electrically connecting the first pad and the first conductive connector, comprising a first conductive portion, a second conductive portion on the first conductive portion, and a connecting portion connecting the first conductive portion and the second conductive portion, wherein the first conductive portion and the second conductive portion are not overlapped in a vertical direction, and the first conductive portion, the connecting portion, and the second conductive portion are integrally formed;
   a second conductive structure, electrically connecting the second pad and the second conductive connector, wherein in the vertical direction, a portion of the second conductive structure overlaps with the first conductive structure therebeneath.

2. The semiconductor device of claim 1, wherein the first conductive connector and the first pad are not overlapped in the vertical direction.

3. The semiconductor device of claim 1, wherein the first conductive structure is in direct contact with the first pad and the first conductive connector.

4. The semiconductor device of claim 1, further comprising a first dielectric layer, wherein the first dielectric layer comprises a first block, a second block with a top surface higher than the first block, and an inclined block connecting the first block and the second block, and the first conductive portion, the connecting portion, and the second conductive portion are respectively disposed on the first block, the inclined block, and the second block.

5. The semiconductor device of claim 4, further comprising a second dielectric layer covering the first conductive structure, wherein the second conductive structure is formed on the second dielectric layer, and a top surface of the second dielectric layer is substantially coplanar with a top surface of the first dielectric layer.

6. The semiconductor device of claim 4, wherein the first dielectric layer further comprises an opening that exposes the first pad, and the first conductive structure is electrically connected to the first pad through the opening.

7. The semiconductor device of claim 1, further comprising a second dielectric layer disposed between the first conductive structure and the second conductive structure, wherein the second dielectric layer comprises an opening that exposes the first conductive structure, and the first conductive structure is electrically connected to the first conductive connector through the opening.

8. The semiconductor device of claim 1, wherein the portion of the second conductive structure is disposed between the first conductive portion and the second conductive portion in the vertical direction.

9. The semiconductor device of claim 8, wherein the second conductive structure further comprises a through via on the portion of the second conductive structure, and the through via is in direct contact with the portion of the second conductive structure.

10. The semiconductor device of claim 1, further comprising a third conductive structure, wherein the portion of the second conductive structure is disposed between a top surface and a bottom surface of the third conductive structure, and in a vertical direction, the third conductive structure overlaps with the portion of the second conductive structure therebeneath.

* * * * *